(12) United States Patent
Lee

(10) Patent No.: US 11,094,769 B2
(45) Date of Patent: *Aug. 17, 2021

(54) ORGANIC LIGHT-EMITTING DIODE DISPLAY

(71) Applicant: Samsung Display Co., Ltd., Yongin-si (KR)

(72) Inventor: Won Se Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/559,408

(22) Filed: Sep. 3, 2019

(65) Prior Publication Data

US 2019/0393293 A1 Dec. 26, 2019

Related U.S. Application Data

(63) Continuation of application No. 16/223,047, filed on Dec. 17, 2018, now Pat. No. 10,403,706, which is a continuation of application No. 14/754,186, filed on Jun. 29, 2015, now Pat. No. 10,157,972.

(30) Foreign Application Priority Data

Jan. 16, 2015 (KR) .................. 10-2015-0008165

(51) Int. Cl.
*H01L 27/32* (2006.01)

(52) U.S. Cl.
CPC ...... *H01L 27/3276* (2013.01); *H01L 27/3246* (2013.01); *H01L 27/3248* (2013.01)

(58) Field of Classification Search
CPC ............ H01L 27/3276; H01L 27/3246; H01L 51/5246; H01L 27/3258; H01L 27/3248
See application file for complete search history.

(56) References Cited

U.S. PATENT DOCUMENTS

| | | | |
|---|---|---|---|
| 8,362,690 B2 | 1/2013 | Son et al. | |
| 10,403,706 B2* | 9/2019 | Lee ..................... | H01L 27/3276 |
| 2005/0001546 A1 | 1/2005 | Yamaguchi | |
| 2005/0200270 A1 | 9/2005 | Kwak et al. | |
| 2009/0072724 A1 | 3/2009 | Seki et al. | |
| 2011/0310076 A1 | 12/2011 | Kim | |
| 2012/0162053 A1 | 6/2012 | Lee et al. | |
| 2013/0049062 A1* | 2/2013 | Hatano ............... | H01L 51/5246 257/99 |

FOREIGN PATENT DOCUMENTS

| | | |
|---|---|---|
| JP | 2007-80600 A | 3/2007 |
| KR | 10-2007-0071904 A | 7/2007 |
| KR | 10-2009-0011656 A | 2/2009 |
| KR | 10-2012-0072948 A | 7/2012 |

\* cited by examiner

*Primary Examiner* — Kevin Quarterman
(74) *Attorney, Agent, or Firm* — Lewis Roca Rothgerber Christie LLP

(57) ABSTRACT

An organic light-emitting diode display is disclosed. In one aspect, the display includes a substrate including a pixel area and a peripheral area surrounding the pixel area and an organic light-emitting element formed in the pixel area and including a first electrode, an organic emission layer, and a second electrode. The display also includes a common voltage line formed in the peripheral area and configured to provide a common voltage to the second electrode, wherein the common voltage line and the first electrode are formed of the same material.

22 Claims, 4 Drawing Sheets

ORGANIC LIGHT-EMITTING DIODE DISPLAY

INCORPORATION BY REFERENCE TO ANY PRIORITY APPLICATIONS

This application is a continuation of U.S. patent application Ser. No. 16/223,047, filed Dec. 17, 2018, which is a continuation of U.S. patent application Ser. No. 14/754,186, filed Jun. 29, 2015, now U.S. Pat. No. 10,157,972, which claims priority to and the benefit of Korean Patent Application No. 10-2015-0008165, filed Jan. 16, 2015, the entire content of all of which is incorporated herein by reference.

BACKGROUND

Field

The described technology generally relates to an organic light-emitting diode display.

Description of the Related Technology

An organic light-emitting diode (OLED) display includes two electrodes and an organic emission layer formed therebetween and generates excitons by combining electrons injected from a cathode which is one of the two electrodes with holes injected from an anode on the organic emission layer and emits light by allowing the excitons to emit energy.

SUMMARY OF CERTAIN INVENTIVE ASPECTS

One inventive aspect relates to an OLED display having a structure in which power is supplied to a display panel through a common voltage ELVSS wiring.

Another aspect is an OLED display having advantages of reducing a width of a dead space and implementing slimness of a display device, by removing a common voltage line formed in a peripheral area and making an anode formed in a pixel area and the peripheral area serve as the common voltage line.

Another aspect is an OLED display, including: a substrate divided into a pixel area and a peripheral area enclosing the pixel area; an organic light-emitting element formed in the pixel area and including a first electrode, an organic emission layer, and a second electrode; and a common voltage line formed in the peripheral area of the substrate and transferring a common voltage from the outside to the second electrode, wherein the common voltage line is made of the same material as the first electrode.

The common voltage line may be connected to a first electrode formed in the pixel area, in the peripheral area.

The pixel area may include a driving thin film transistor which includes a semiconductor layer, a gate insulating layer, a gate electrode, a source/drain electrodes which are connected to the semiconductor layer and the common voltage line may be formed on the same layer as the source/drain electrodes.

The peripheral area may be further provided with a sealing member which is coupled with an encapsulation member to encapsulate the pixel area and the peripheral area of the substrate from the outside.

The common voltage line may extend toward a lower portion of the sealing member of the peripheral area.

The lower portion of the common voltage line may be further provided with a dummy wiring which is made of metal for a gate wiring.

The common voltage line may be formed on a lower portion of a pixel defining layer formed in the peripheral area and may be formed on an upper portion and a side portion of a passivation layer which covers and protects the source/drain electrodes of the driving thin film transistor.

The second electrode may be formed on an upper portion of the pixel defining layer, in the pixel area.

Another aspect is an organic light-emitting diode (OLED) display, comprising: a substrate including a pixel area and a peripheral area surrounding the pixel area; an organic light-emitting element formed in the pixel area and including a first electrode, an organic emission layer, and a second electrode; and a common voltage line formed in the peripheral area and configured to provide a common voltage to the second electrode, wherein the common voltage line and the first electrode are formed of the same material.

In the above display, the first electrode is connected to the common voltage line adjacent to a border of the pixel area and the peripheral area. In the above display, the pixel area includes a driving thin film transistor which includes a semiconductor layer, a gate insulating layer, a gate electrode, source and drain electrodes which are connected to the semiconductor layer, and wherein the common voltage line is formed on the same layer as the source and drain electrodes. The above display further comprises a passivation layer formed over the driving thin film transistor. In the above display, the first electrode is formed on the passivation layer. In the above display, at least a portion of the common voltage line is connected to the first electrode on the passivation layer. In the above display, the first electrode comprises a plurality of electrodes, wherein at least one of the electrodes is connected to the common voltage line, and wherein the remaining electrodes are not connected to the common voltage line.

The above display further comprises a plurality of pixel defining layers formed on the passivation layer. In the above display, a gap is formed between adjacent electrodes of the first electrode, and wherein the pixel defining layers are formed on the gap and the adjacent electrodes. In the above display, at least one of the pixel defining layers has a width different from those of the remaining pixel defining layers. The above display further comprises a sealing member formed in the peripheral area, wherein the sealing member is connected to an encapsulation member to encapsulate the pixel area and the peripheral area from the environment. In the above display, the common voltage line extends toward a lower portion of the sealing member. The above display further comprises a dummy wiring line formed of metal in a lower portion of the common voltage line. In the above display, the common voltage line is formed on a lower portion of a pixel defining layer formed in the peripheral area, and is formed on an upper portion and a side portion of a passivation layer which covers and protects source and drain electrodes of a driving thin film transistor. In the above display, the second electrode is formed on an upper portion of the pixel defining layer, in the pixel area.

Another aspect is an organic light-emitting diode (OLED) display, comprising: a substrate including a pixel area and a peripheral area surrounding the pixel area; an organic light-emitting element formed in the pixel area and including a first electrode, an organic emission layer, and a second electrode; and a common voltage line formed in the peripheral area and configured to provide a common voltage to the second electrode, wherein the common voltage line is formed only in the peripheral area.

In the above display, the common voltage line and the first electrode are formed of the same material. In the above display, the first electrode is connected to the common voltage line adjacent to a border of the pixel area and the peripheral area. In the above display, the common voltage line includes a linear portion and a non-linear portion, wherein the pixel area includes a driving thin film transistor which includes source and drain electrodes, and wherein the linear portion of the common voltage line is formed on the same layer as the source and drain electrodes. The above display further comprises a passivation layer formed over the driving thin film transistor, wherein the non-linear portion of the common voltage line is formed on a side surface of the passivation layer.

According to at least one of the disclosed embodiments, it is possible to reduce the width of the dead space and implementing the slimness of the display device, by removing the common voltage line formed in the peripheral area and making the anode formed in the pixel area and the peripheral area serve as the common voltage line.

DETAILED DESCRIPTION OF CERTAIN INVENTIVE EMBODIMENTS

Figure 4:
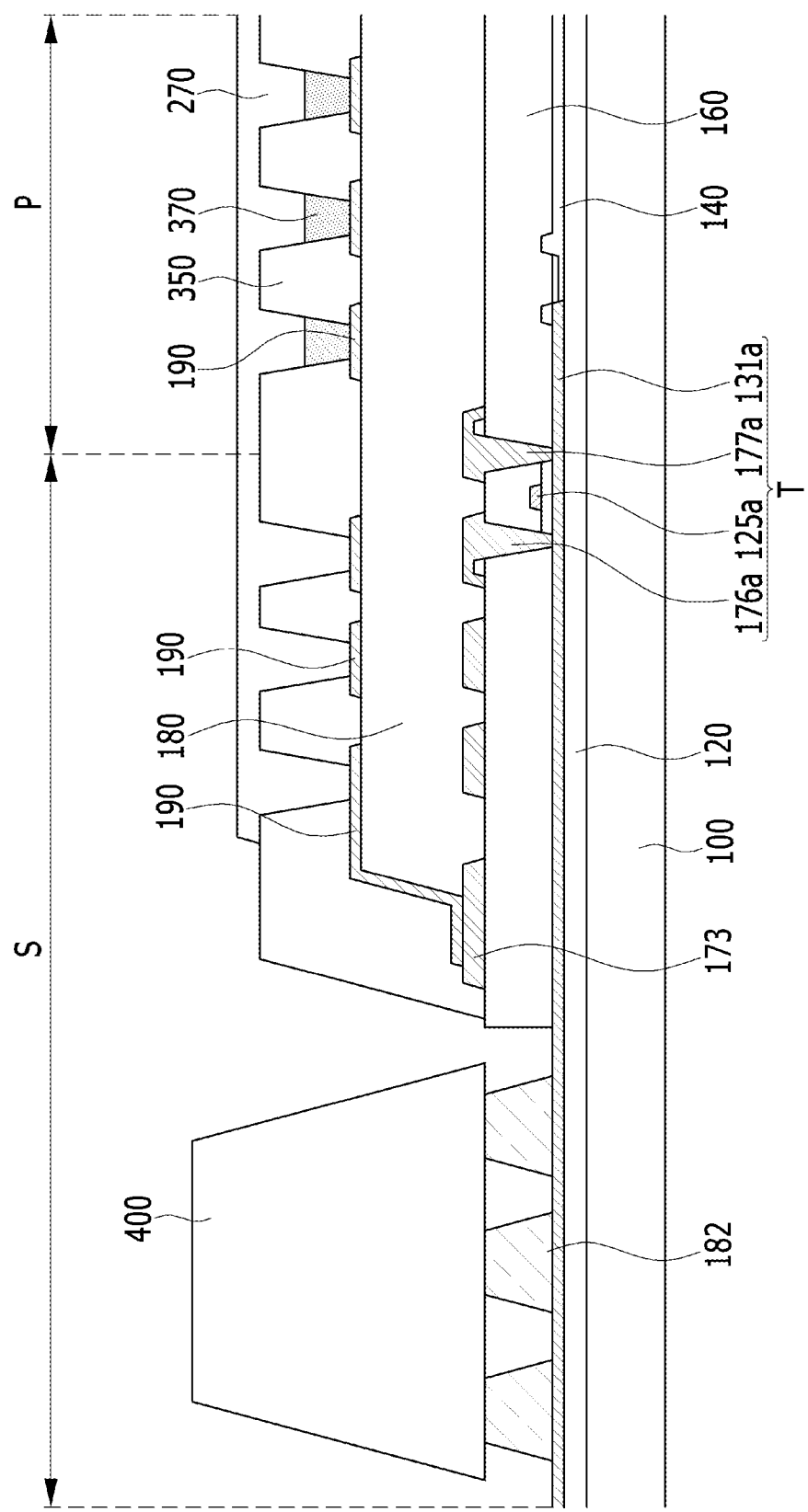
FIG. 4 is a cross-sectional view illustrating a typical OLED display.

FIG. 4 is a cross-sectional view illustrating a typical OLED display (not necessarily prior art). As illustrated in FIG. 4, the OLED display includes a substrate 100 which is divided into a pixel area P and a peripheral area S, and a thin film encapsulation (TFE) layer which encapsulates an inorganic layer and an organic layer which are alternately stacked on a substrate in at least one layer.

The pixel area P includes a plurality of OLEDs which are connected between scan lines and data lines in a matrix form to configure pixels. The OLED includes an anode 190, a cathode 270, and an organic emission layer 370 which is formed between the anode 190 and the cathode 270. The peripheral area S includes a scan end and a data end which extend from a scan line and a data line of the pixel area P, a driving voltage line ELVDD for an operation of an OLED, a common voltage line ELVSS, and a scan driver and a data driver which process a signal provided from outside the display and supply the processed signal to the scan end and the data end.

Each unit pixel includes a driving thin film transistor T, a capacitor, and an OLED. The driving thin film transistor T and the capacitor receive driving voltage ELVDD from the driving voltage line and the driving thin film transistor T serves to control a current flowing in the OLED through the driving voltage line. Further, a common voltage line 173 connected to a common electrode 270 which is a cathode supplies the common voltage ELVSS to the cathode 270 to generate a potential difference in a pixel electrode 190 which is an anode and the common electrode 270 to make a current flow.

As the width of the common voltage line 173 formed in the peripheral area is reduced, a dead space increases, and as the width of the dead space is reduced, power consumption may be reduced. Therefore, it is difficult to slim down the display panel while securing appropriate power consumption and a predetermined width of the common voltage line.

Hereinafter, embodiments will be described more fully hereinafter with reference to the accompanying drawings, in which exemplary embodiments are shown. As those skilled in the art would realize, the described embodiments may be modified in various different ways, all without departing from the spirit or scope of the present invention.

Further, in exemplary embodiments, since like reference numerals designate like elements having the same configuration, an exemplary embodiment is representatively described, and in other exemplary embodiments, only a configuration different from the exemplary embodiment will be described.

It is to be noted that the accompanying drawings is schematically illustrated and is not illustrated to a scale. A relative dimension and ratio of components are illustrated being exaggerated or reduced in the drawings for clarity and convenience in the drawings and any dimension is only an example and therefore is not limited thereto. Further, the same structures, elements, or parts which are illustrated in at least two drawings are denoted by the same reference numerals, which are used to indicate similar features. The mention that any portion is present "over" or "on" another portion means that any portion may be directly formed on another portion or a third portion may be interposed between one portion and another portion.

An exemplary embodiment will be described in detail. As the result, numerous variations of exemplary embodiments are expected. Therefore, the exemplary embodiments are not limited to a specific form of the illustrated region and, for example, also include a form changed by manufacturing. In this disclosure, the term "substantially" includes the meanings of completely, almost completely or to any significant degree under some applications and in accordance with those skilled in the art. Moreover, "formed on" can also mean "formed over." The term "connected" includes an electrical connection.

Hereinafter, an OLED display according to an exemplary embodiment will be described with reference to FIGS. 1 to 3.

Figure 1:
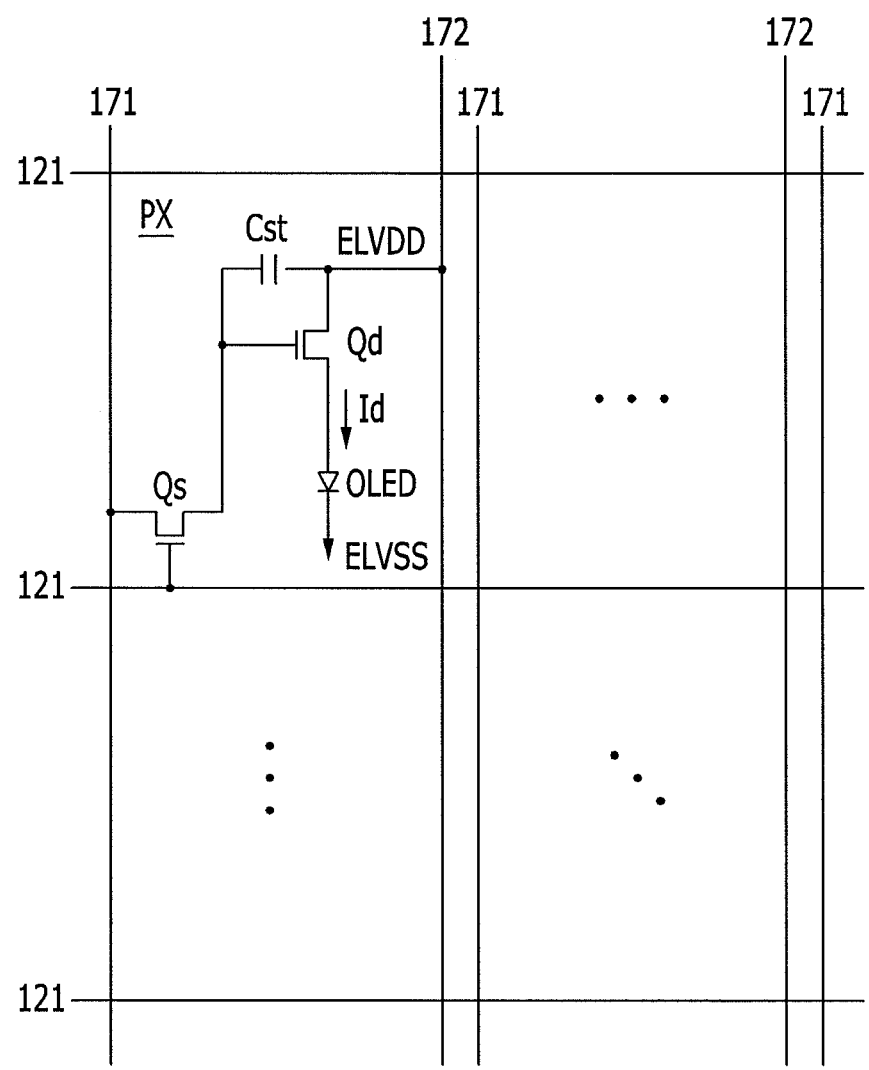
FIG. 1 is an equivalent circuit diagram of an OLED display according to an exemplary embodiment.

FIG. 1 is an equivalent circuit diagram of an OLED display according to an exemplary embodiment.

Referring to FIG. 1, the OLED display includes a plurality of signal lines 121, 171, and 172 and a plurality of pixels PXs which are connected to the signal lines and are arranged in a substantially matrix form.

The signal line includes a plurality of gate lines 121 which transfer scan signals (or gate signals), a plurality of data lines 171 which transfer data signals, and a plurality of driving voltage lines 172 which transfer a driving voltage ELVDD. The gate lines 121 extend in a substantially row direction and are substantially parallel with each other and the data lines 171 and the driving voltage lines 172 extend in a substantially column direction and are substantially parallel with each other.

Each pixel PX includes a switching thin film transistor Qs, a driving thin film transistor Qd, a storage capacitor Cst, and an OLED.

The switching thin film transistor Qs includes a control terminal, an input terminal, and an output terminal, in which the control terminal is connected to the gate line 121, the input terminal is connected to the data line 171, and the output terminal is connected to the driving thin film transistor Qd. The switching thin film transistor Qs transfers the data signal applied to the data line 171 to the driving thin film transistor Qd in response to the scan signal applied to the gate line 121.

The driving thin film transistor Qd also includes a control terminal, an input terminal, and an output terminal, in which the control terminal is connected to the switching thin film transistor Qs, the input terminal is connected to the driving voltage line 172, and the output terminal is connected to the OLED. The driving thin film transistor Qd transfers an output current Id of which a magnitude varies depending on a voltage applied between the control terminal and the output terminal.

The storage capacitor Cst is connected between the control terminal and the input terminal of the driving thin film transistor Qd. The storage capacitor Cst charges the data signal applied to the control terminal of the driving thin film transistor Qd and maintains the charged data signal even after the switching thin film transistor Qs is turned off.

The OLED includes an anode connected to the output terminal of the driving thin film transistor Qd and a cathode connected to a common voltage (ELVSS). The OLED emits light of which the intensity varies depending on the output current Id of the driving thin film transistor Qd to display an image.

In some embodiments, each of the switching thin film transistor Qs and the driving thin film transistor Qd is an n-channel field effect transistor (FET). However, at least one of the switching thin film transistor Qs and the driving thin film transistor Qd may be a p-channel field effect transistor. Further, a connection relationship among the thin film transistors Qs and Qd, the capacitor Cst, and the OLED may be changed.

Figure 2:
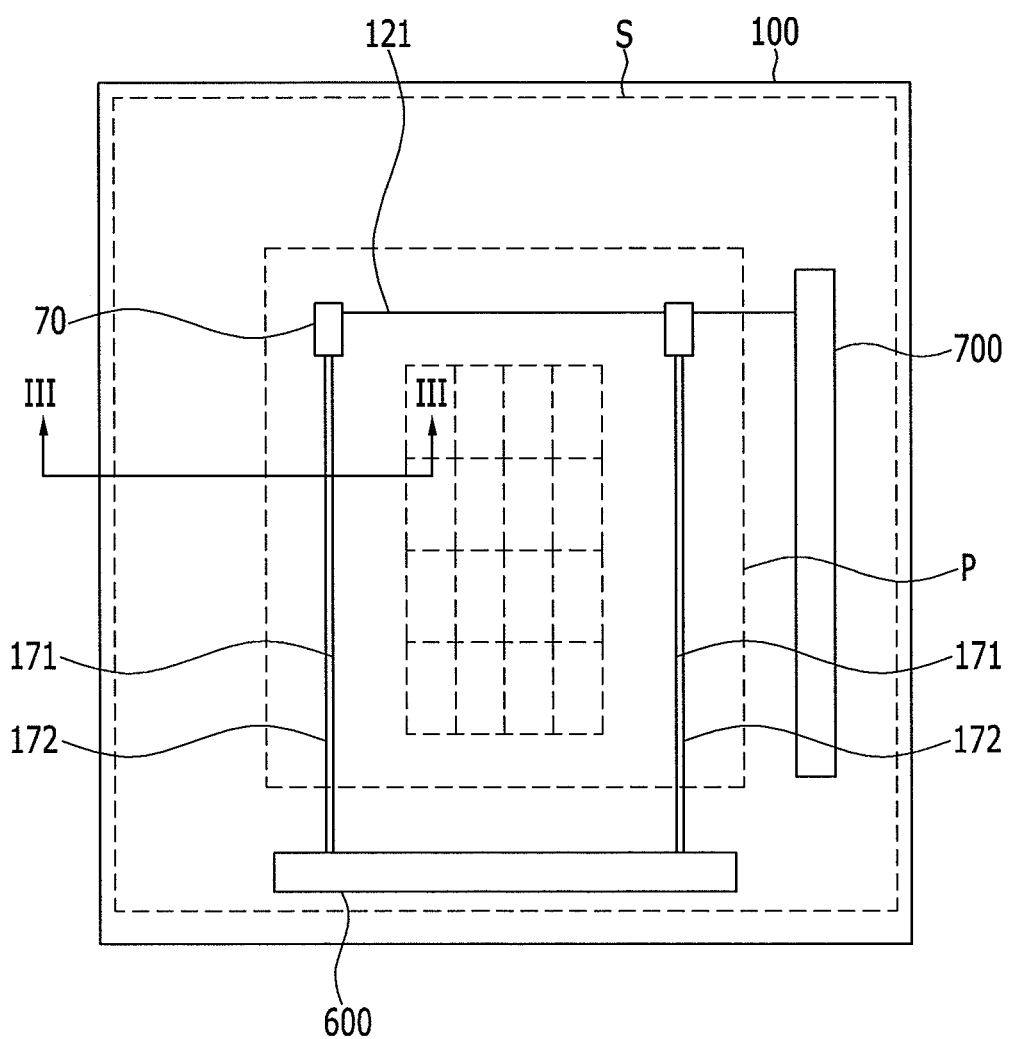
FIG. 2 is a plan view of a pixel area and a peripheral area of the OLED display according to the exemplary embodiment.
Figure 3:
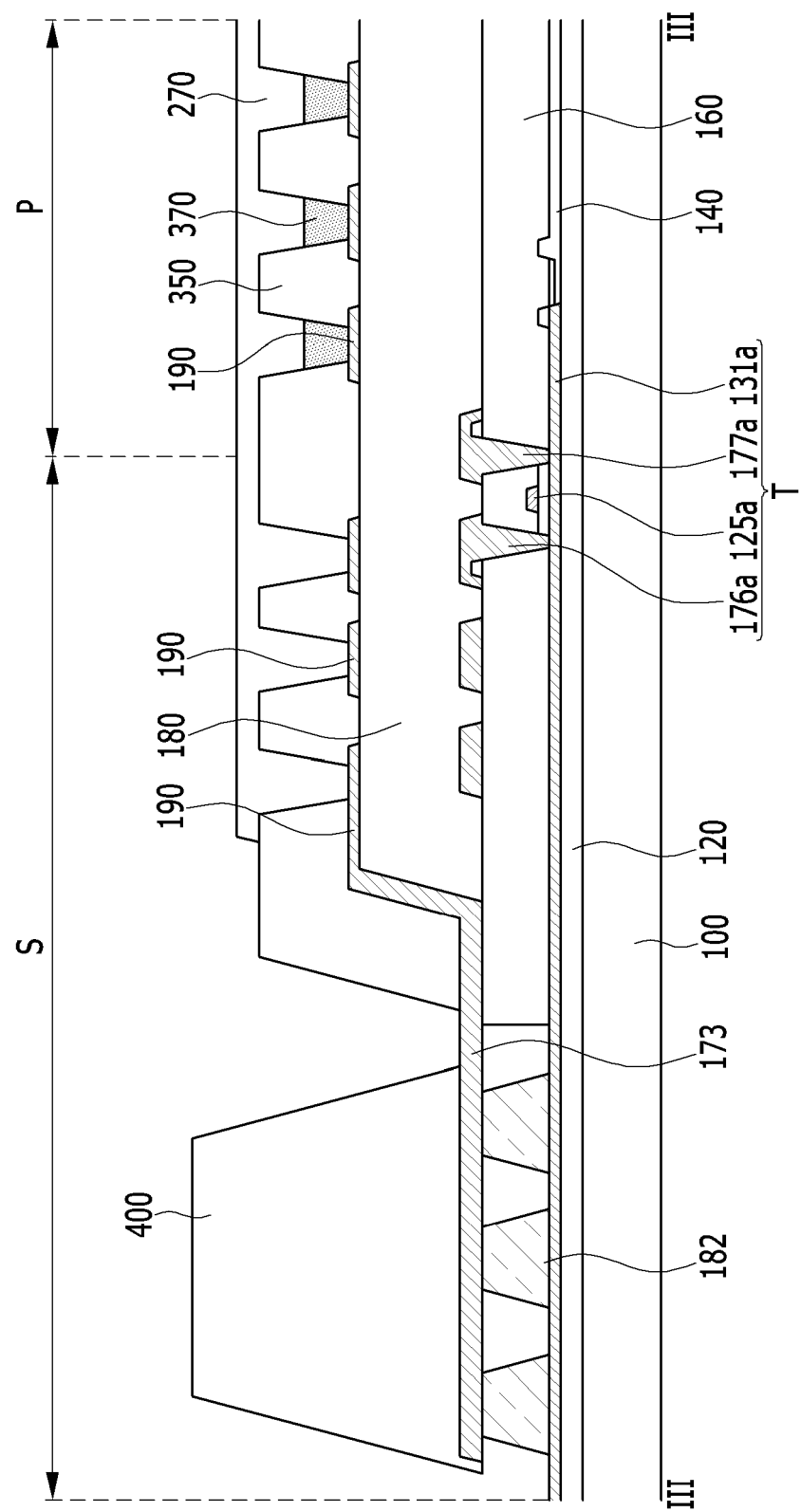
FIG. 3 is a cross-sectional view taken along the line of FIG. 2.

FIG. 2 is a plan view of a pixel area and a peripheral area of the OLED display according to the exemplary embodiment and FIG. 3 is a cross-sectional view taken along the line of FIG. 2.

Referring to FIGS. 2 and 3, a substrate 100 of the OLED display includes a pixel area P and a peripheral area S surrounding the pixel area P.

The pixel area P of the substrate 100 includes a plurality of OLEDs 70 which are connected among a scan line 121 transferring a scan signal, a data line 171 transferring a data signal, and a driving voltage line 172 transferring a driving voltage ELVDD in a matrix form. The OLED 70 includes a first electrode 190 which is a pixel electrode, a second electrode 270 which is a common electrode, and an organic emission layer 370 which is formed between the first and second electrodes 190 and 270. The organic emission layer 370 is formed in a structure in which a hole transportation layer, an organic emission layer, and an electronic transportation layer are stacked and may further include a hole injection layer and an electron injection layer.

The substrate 100 may be formed as an insulating substrate which is made of glass, quartz, ceramic, plastic, or the like. However, the present invention is not limited thereto. For example, the substrate 100 may also be formed as a metallic substrate made of stainless steel, and the like.

A buffer layer 120 which serves to prevent permeation of impurity elements and planarize a surface is formed on the substrate 100. A semiconductor layer 131*a* is formed on the buffer layer 120. The semiconductor layer 131*a* is formed as a polysilicon layer. Further, the semiconductor layer 131*a* includes a channel region which is not doped with impurities and a source region and a drain region formed by p+ doping both sides of the channel region with impurities. In this case, the doped ion material is P-type impurity such as boron (B) and as the doped ion material, $B_2H_6$ may be mainly used. Here, the impurity is changed depending on a kind of thin film transistor T.

The pixel area P of the substrate 100 includes the thin film transistor T for controlling an operation of the OLED 70 and a capacitor (not illustrated) for maintaining a signal. The thin film transistor T includes a switching thin film transistor (not illustrated) and the driving thin film transistor T, in which the driving thin film transistor T is connected to the first electrode 190. The driving thin film transistor T includes the semiconductor layer 131*a*, a source electrode 176*a*, a drain electrode 177*a*, and a gate electrode 125*a*.

The semiconductor layer 131*a* provides a source region, a drain region, and a channel region, in which the source region and the drain region are connected to a source electrode 176*a* and a drain electrode 177*a* and an upper portion of the channel region includes a gate electrode 125*a* which is insulated from the semiconductor layer 131*a* by the gate insulating layer 140. The gate insulating layer 140 may be made of silicon nitride ($SiN_x$) or silicon oxide $SiO_2$, and the like and the gate electrode 125*a* is formed to overlap at least a portion of the semiconductor layer 131*a*, in particular, the channel region.

The peripheral area S of the substrate 100 includes a common voltage line 173 which transfers the common voltage ELVSS to a second electrode 270 of the OLED 70 and a scan driver 700 and a data driver 600 which process a signal provided from the outside and supply the processed signal to the scan line 121 and the data line 171, respectively. The scan driver 700 and the data driver 600 convert the signal provided from the outside into a scan signal and a data signal to selectively drive each pixel PX.

Referring to FIG. 3, in the OLED display, the buffer layer 120 is formed on the pixel area P and the peripheral area S of the substrate 100 and the semiconductor layer 131*a* is formed on the buffer layer 120. The semiconductor layer 131*a* which is formed in the pixel area P proves an active layer of the thin film transistor T for driving the OLED 70.

The upper portion of the pixel area P including the semiconductor layer 131*a* and the peripheral area S includes a gate insulating layer 140 and the gate electrode 125*a* is formed on the gate insulating layer 140 on the semiconductor layer 131*a*.

The upper portion of the pixel area P and the peripheral area S including the gate electrode 125*a* includes an interlayer insulating layer 160. The interlayer insulating layer 160 and the gate insulating layer 140 includes a contact hole to expose a predetermined portion of the semiconductor layer 131*a* and includes a source electrode and a drain electrode 176*a* and 177*a* which are connected to the semiconductor layer 131*a* through the contact hole. Similar to the gate insulating layer 140, the interlayer insulating layer 140 may be made of ceramic-based materials such as silicon nitride ($SiN_x$) and silicon oxide ($SiO_2$). In this case, the pixel area P includes the data line 171 which is connected to the source and drain electrodes 176*a* and 177*a* and the peripheral area S includes the common voltage line 173.

The pixel area P and a portion of the peripheral area S include a passivation layer 180. When a sealing member 400 which is formed at an outermost portion of the peripheral area S contacts the passivation layer 180, the passivation layer 180 may be damaged by a laser hardening process for hardening the sealing member 400 and therefore only a portion of the peripheral area S includes the passivation layer 180 and an outside of the peripheral area S does not include the passivation layer 180.

The passivation layer 180 of the pixel area P includes a via hole to expose a predetermined portion of the drain electrode 177a and the outermost portion of the peripheral area S does not include the passivation layer 180 and thus a predetermined portion of the common voltage line 173 is exposed. The first electrode 190 which is connected to the drain electrode 177a through the via hole is formed on the passivation layer 180 of the pixel area P.

The passivation layer 180 may be formed of at least one material of polyacrylates resin, epoxy resin, phenolic resin, polyamides resin, polyimides rein, unsaturated polyesters resin, poly phenylenethers resin, poly phenylenesulfides resin, benzocyclobutene (BCB), and the like.

Meanwhile, the upper portion of the pixel area P includes the pixel defining layer 350 and the pixel defining layer 350 includes an opening to expose some area (emission area) of the first electrode 190. The organic emission layer 370 is formed on the exposed first electrode 190 and the second electrode 270 which is connected to the common voltage line 173 is formed on the pixel defining layer 350 which is formed in the pixel area P and the peripheral area S. The pixel defining layer 350 may be formed of resin such as polyacrylates and polyimides, silica-based inorganic materials, and the like.

Meanwhile, the common voltage line 173 may be formed of the same material as the first electrode 190. Further, the common voltage line 173 may be connected to the first electrode 190 formed in the pixel area P, in the peripheral area.

As described above, the pixel area P includes the driving thin film transistor T which includes the semiconductor layer 131a, the gate insulating layer 140, the gate electrode 125a, and the source and drain electrodes 176a and 177a connected to the semiconductor layer 131a and the common voltage line 173 is formed on the same layer as the source and drain electrodes 176a and 177a of the driving thin film transistor T.

Meanwhile, the peripheral area S may further include the sealing member 400 which is connected to an encapsulation member (not illustrated) to encapsulate the pixel area P and the peripheral area S of the substrate 100 from the outside. The sealing member 400 serves to protect the driving thin film transistor T, the organic light-emitting element, and the like from impurities such as external moisture, oxygen, or the like.

The common voltage line 173 is connected to the first electrode 190 of the pixel area P and thus extends toward the lower portion of the sealing member 400 of the peripheral area S.

Meanwhile, the lower portion of the common voltage line 173 may include a dummy wiring 182 which is formed of metal for a gate wiring. The dummy wiring 182 more facilitates bonding between the buffer layer 120 and the sealing member 400 or the common voltage line 173 and takes charge of a role of the common voltage line 173 to obtain an effect of substantially increasing a thickness of the common voltage line 173, thereby reducing wire resistance.

Meanwhile, the common voltage line 173 may be formed on the lower portion of the pixel defining layer 350 which is formed in the peripheral area S and may be formed on an upper portion and a side portion of the passivation layer 180 which covers and protects the source and drain electrodes 176a and 177a of the driving thin film transistor T. Further, the second electrode 270 is formed on the pixel defining layer 350, in the pixel area P.

According to at least one of the disclosed embodiments, it is possible to reduce the size of the dead space and manufacture a thinner display device, by removing at least a majority portion of the common voltage line formed in the peripheral area and making the anode formed in the pixel area and the peripheral area serve as the common voltage line.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate comprising a pixel area and a peripheral area outside the pixel area;
   a driving thin film transistor in the pixel area, the driving thin film transistor comprising a semiconductor layer, a gate insulating layer, a gate electrode, and source and drain electrodes connected to the semiconductor layer;
   a passivation layer over the driving thin film transistor;
   a plurality of first electrodes on the passivation layer;
   a light-emitting element in the pixel area and over the passivation layer, the light-emitting element comprising a first electrode in the pixel area from among the plurality of first electrodes, an emission layer, and a second electrode; and
   a common voltage line in the peripheral area and configured to provide a common voltage to the second electrode,
   wherein:
   the common voltage line is in contact with a first electrode in the peripheral area from among the plurality of first electrodes.

2. The display device of claim 1, wherein the common voltage line is directly connected to the first electrode in the peripheral area.

3. The display device of claim 1, further comprising an insulating layer on the passivation layer and having an opening on the first electrode in the pixel area,
   wherein the insulating layer contacts an upper surface of the passivation layer between adjacent first electrodes in the pixel area from among the plurality of first electrodes.

4. The display device of claim 3, wherein the common voltage line comprises a first portion on the upper surface of the passivation layer.

5. The display device of claim 4, wherein the common voltage line is at a same layer as the first electrode in the peripheral area, on the passivation layer.

6. The display device of claim 4, wherein the common voltage line further comprises a second portion contacting a side surface of the passivation layer, and the second portion is connected to the first portion.

7. The display device of claim 6, wherein at least one of the first portion and the second portion is between the passivation layer and the insulating layer.

8. The display device of claim 6, further comprising an interlayer insulating layer between the source and drain electrodes and the gate electrode,
   wherein the common voltage line further comprises a third portion on and contacting the interlayer insulating layer in the peripheral area.

9. The display device of claim 1, further comprising a sealing member in the peripheral area,
wherein the sealing member is connected to an encapsulation member to encapsulate the pixel area and the peripheral area.

10. The display device of claim 9, wherein the common voltage line comprises a portion between the substrate and the sealing member in a sectional view.

11. The display device of claim 10, further comprising a dummy wiring line between the substrate and the common voltage line in the sectional view,
wherein the common voltage line is connected to the dummy wiring line.

12. A display device comprising:
a substrate comprising a pixel area and a peripheral area outside the pixel area;
a driving thin film transistor in the pixel area, the driving thin film transistor comprising a semiconductor layer, a gate insulating layer, a gate electrode, and source and drain electrodes connected to the semiconductor layer;
a passivation layer over the driving thin film transistor;
a plurality of first electrodes on the passivation layer;
a light-emitting element in the pixel area and over the passivation layer, the light-emitting element comprising a first electrode in the pixel area from among the plurality of first electrodes, an emission layer, and a second electrode;
a common voltage line in the peripheral area and configured to provide a common voltage to the second electrode; and
a sealing member in the peripheral area,
wherein the sealing member is in contact with the common voltage line in the peripheral area.

13. The display device of claim 12, wherein the common voltage line is directly connected to a first electrode in the peripheral area from among the plurality of first electrodes.

14. The display device of claim 12, further comprising an insulating layer on the passivation layer and having an opening on the first electrode in the pixel area,
wherein the insulating layer contacts an upper surface of the passivation layer between adjacent first electrodes in the pixel area from among the plurality of first electrodes.

15. The display device of claim 14, wherein the common voltage line comprises a first portion on the upper surface of the passivation layer.

16. The display device of claim 15, wherein the common voltage line is at a same layer as the first electrode, on the passivation layer.

17. The display device of claim 15, wherein the common voltage line further comprises a second portion contacting a side surface of the passivation layer, and the second portion is connected to the first portion.

18. The display device of claim 17, wherein at least one of the first portion and the second portion is between the passivation layer and the insulating layer.

19. The display device of claim 17, further comprising an interlayer insulating layer between the source and drain electrodes and the gate electrode,
wherein the common voltage line further comprises a third portion on and contacting the interlayer insulating layer in the peripheral area.

20. The display device of claim 12, wherein the sealing member is connected to an encapsulation member to encapsulate the pixel area and the peripheral area.

21. The display device of claim 20, wherein the common voltage line comprises a portion between the substrate and the sealing member in a sectional view.

22. The display device of claim 21, further comprising a dummy wiring line between the substrate and the common voltage line in the sectional view,
wherein the common voltage line is connected to the dummy wiring line.

* * * * *